United States Patent [19]
Patchen

[11] Patent Number: 5,659,458
[45] Date of Patent: Aug. 19, 1997

[54] HEAT DISSIPATIVE MEANS FOR INTEGRATED CIRCUIT CHIP PACKAGE

[76] Inventor: Lyle E. Patchen, 12072 Butternut St., NW., Minneapolis, Minn. 55448

[21] Appl. No.: 301,148

[22] Filed: Sep. 6, 1994

Related U.S. Application Data

[63] Continuation-in-part of Ser. No. 74,249, Jun. 9, 1993, abandoned.

[51] Int. Cl.$^6$ ............................................. H05K 7/20
[52] U.S. Cl. ...................... 361/704; 257/678; 257/713; 257/796; 361/707; 361/715; 361/719; 361/720
[58] Field of Search ................... 165/80.2, 80.3, 165/185; 174/16.3; 257/678, 706–707, 712–713, 728–729, 731, 789, 795, 796; 361/704–723

[56] References Cited

U.S. PATENT DOCUMENTS

| | | | |
|---|---|---|---|
| 3,728,584 | 4/1973 | Kuhlow | 174/16.3 |
| 3,984,166 | 10/1976 | Hutchison | 174/16.3 |
| 4,509,096 | 4/1985 | Baldwin et al. | 361/705 |
| 4,924,352 | 5/1990 | Septfons | 361/718 |
| 5,043,845 | 8/1991 | McDermott et al. | 361/705 |
| 5,198,887 | 3/1993 | Brown | 361/717 |
| 5,467,251 | 11/1995 | Katchmar | 361/719 |

FOREIGN PATENT DOCUMENTS

| | | | |
|---|---|---|---|
| 63-307768 | 12/1988 | Japan | 361/719 |
| 4051597 | 2/1992 | Japan | 361/719 |

*Primary Examiner*—Gregory D. Thompson
*Attorney, Agent, or Firm*—Roger W. Jensen

[57] ABSTRACT

An integrated circuit chip package has a substrate having first and second mutually parallel sides and a preselected thickness and a space on the first side for the mounting thereon of an electronic component having a body with a flat surface. The substrate further includes a plurality of elongated thermal conductive members, each having a head portion adapted to be in contact with the flat surface of the electronic component. The members further have elongated body portions of a preselected length greater than the thickness of the substrate. The thermal conductive members extend through preselected holes in the substrate whereby heat may be conducted from the flat surface of the component through the thermal conductive member to the other side of the substrate.

4 Claims, 5 Drawing Sheets

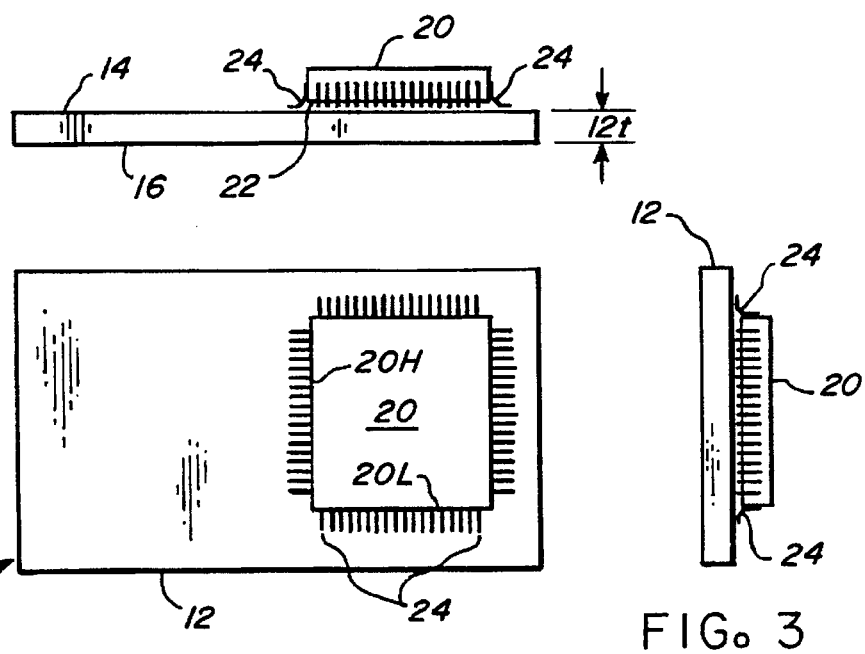
FIG. 2
FIG. 1
FIG. 3
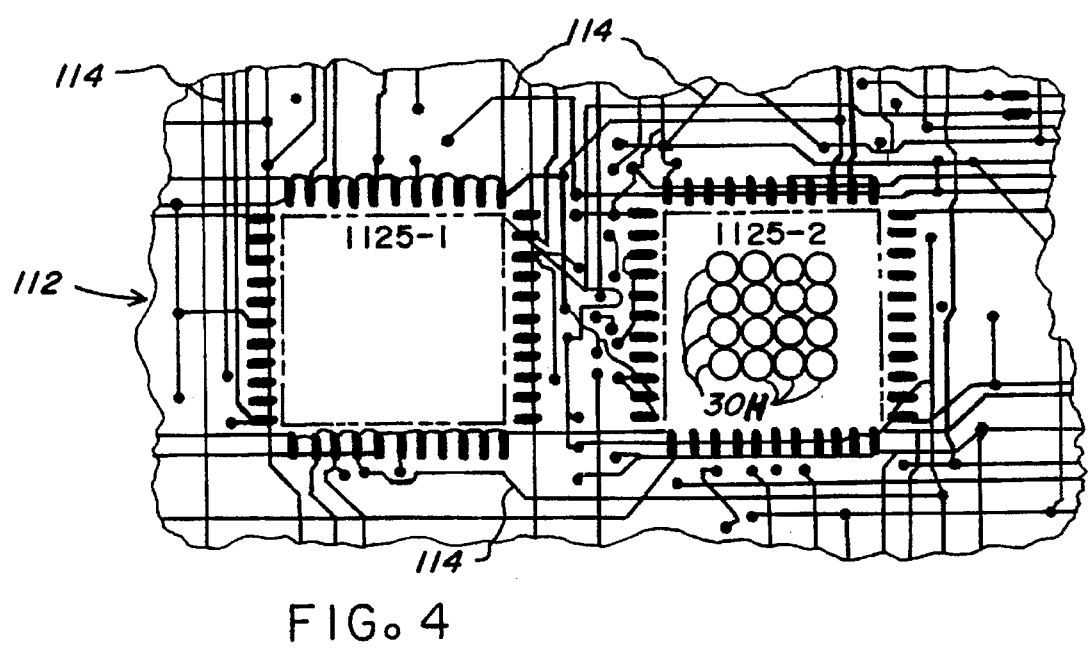
FIG. 4

HEAT DISSIPATIVE MEANS FOR INTEGRATED CIRCUIT CHIP PACKAGE

This is a continuation-in-part of application Ser. No. 08/074,249 filed on Jun. 9, 1993 now abandoned.

FIELD OF THE INVENTION

This invention relates to the field of removing or dissipating heat built up within integrated circuit chip packages. It is interesting to trace the history of dissipating heat from electronic apparatus beginning with the early days of radio, and thence to the invention of vacuum tubes and the cooling of such tubes and associated components such as capacitors, resistors, transformers, chokes or inductors, etc. Offshoots of "radio," of course, included a wide range of apparatus utilizing electromagnetic transmissions, such as radar and sonar. A typical scenario was to have an electronic apparatus perform at the highest possible capability in the smallest possible volume and, as is well known, scores of heat dissipation arrangements were developed to maintain the operating temperature of the apparatus at an acceptable level.

With the advent of integrated circuits and micro processors, there continued to be a need for dissipating or removing undesired heat built up internally within the integrated circuit apparatus. A representative sampling of such prior art arrangements are U.S. Pat. Nos. 4,612,601; 5,088,007; 5,025,347; 3,874,443; 4,292,647; 5,113,315; 4,993,482; 4,849,858; 4,583,149; and 5,019,941.

As is well known, there are several "drivers" in the integrated circuit chip package field. One is the "moving target" of ever better, faster and reliable performance at (hopefully) a lower cost and in a smaller package. Using the computer field as an example, in recent years the suppliers of integrated circuit micro processors have admirably met the demands of the marketplace providing micro processors of ever greater performance in a smaller package and at relatively reasonable prices which, in turn, has triggered a dramatic reduction in the size (and cost) of the overall computer. At this point in time, a small desktop computer of moderate price and using a micro processor outperforms by several orders of magnitude the large "mainframe" computers of a prior generation.

What is also known, but not so widely shared, is that the current micro processors, because they are temperature sensitive, cannot be utilized at their full potential, at least in some applications, because of heat buildup. Take, for example, the "486" micro processor used in a number of currently available computers. These computers have operational limits dictated by the heat buildup problem. Stated otherwise, such computers could perform at a much higher performance level except for the heat buildup problem.

SUMMARY OF THE INVENTION

My invention provides a unique heat dissipative means for an integrated circuit chip package comprising an electronic component such as a "486" micro processor, having a body with at least one flat surface. The package also includes a substrate having first and second mutually parallel sides and a preselected thickness. The substrate may be single layer, double layer, or other multilayered construction. The substrate has on a first side, and/or internally on the additional layers, preselected printed circuit wiring laid out thereon and/or therein following a predetermined architecture to provide a space which (i) is without wiring, and (ii) is at least as large as said one flat surface of the body.

The electronic component is mounted on the substrate with the aforesaid flat surface of the body being in the aforesaid space that is without wiring. My invention provides a means for effectively and efficiently transferring heat built up within the micro processor, and several embodiments of my invention are shown in the drawings.

In one embodiment of the invention, at least one elongated thermal conductive member and usually a plurality of such conductive members are provided. Each conductive member has (i) a head portion, and (ii) an elongated body portion connected at one end to said head portion and having a longitudinal length greater than the preselected thickness of the substrate. At least one and usually a plurality of preselected holes are provided in the substrate in the aforesaid space without wiring. In manufacture, after the thermal conductive members have been inserted into such preselected holes in the substrate, then the micro processor is mounted on the first or top surface of the substrate with the aforesaid flat surface of the electronic component in abutting relationship with the head portions of the thermal conductive members. This simple, inexpensive means is very effective in conducting heat from the underside or flat surface of the micro processor through the head and elongated body portions of the thermal conductive member. The invention further includes additional thermal conductive means on the second side of the substrate in thermal conductive relationship with the ends of the thermal conductive member. For example, flat washer-like members, having a central preselected aperture for receiving the other ends of the elongated body portion of the thermal conductive members, are provided in the preferred embodiment. In this manner, the heat transfer coefficient between the body and the second side of the substrate is dramatically increased. As indicated, the usual case or application would be for the substrate to have a plurality of preselected holes, each of which would receive a thermal conductive member. The layout of the preselected holes is also preselected so as to achieve the desired pattern for heat transfer desired.

Another embodiment provides a solution to the heat build-up problem inherent in the case where the integrated circuit die (IC DIE) or chip is mounted within a recess in the die or chip carrier or housing, an empty space or void being defined between the outer surface of the die and the "bottom" of the die carrier. In this embodiment, my invention provides a thermal conductive material in the aforementioned void and a metal plate (having good thermal conductivity) mounted on the bottom of the die carrier so as to seal off the void and thus retain the thermal conductive material in the void. The opposite side of the metal plate abuts the top or head portions of a plurality of elongated thermal conductive members. As in the prior embodiment, the elongated thermal conductive members have a longitudinal length significantly longer than the thickness of the P.C. board or substrate through which they extend, and they may also be in thermal conductive relationship with additional thermal conductive means on the second or bottom side of the substrate. This arrangement provides a significant surface area for dissipating heat. Thus, the path of heat transfer is from the I.C. die through (i) the thermal conductive material in the void, (ii) the metal plate closing off the void, and (iii) the elongated thermal conductive members.

Another embodiment provides a large area hole or opening in the substrate into which is positioned a thermal conductive member having a large cross-section and a top surface for engaging or contacting the aforesaid underside or flat surface of the micro processor. The member has a plurality of bars depending axially away from the substrate to maximize heat transfer. In another embodiment, the member includes fluid conduit means to facilitate the passage of coolant therethrough for removal of heat from the micro processor.

BRIEF DESCRIPTION OF THE DRAWINGS

FIGS. 1, 2 and 3 are respectively top, front and side views of a somewhat schematic integrated circuit chip substrate having mounted thereon an electronic component;

FIG. 4 is a top view of a portion of a printed circuit substrate;

DETAILED DESCRIPTION OF THE PREFERRED EMBODIMENT

Figure 7:
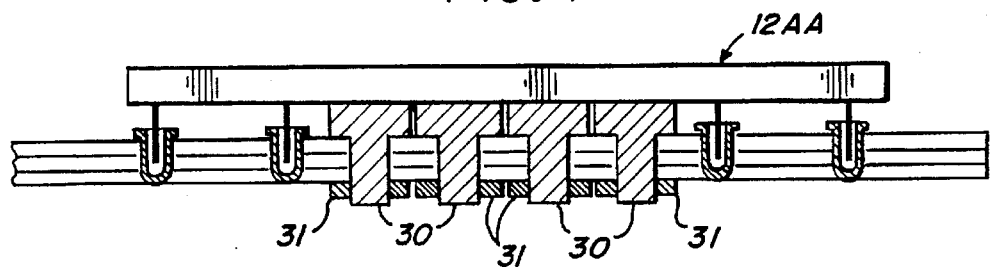
FIG. 7 shows apparatus similar to FIG. 5, except for a "through hole" substrate arrangement for the interconnections to the electronic component.

In FIG. 1, the reference numeral 10 generally designates an integrated circuit chip package comprising a printed circuit substrate 12 and an integrated circuit chip 20. It will be understood by those skilled in the art that in the preceding sentence the expression "integrated circuit chip" is intended to encompass a wide variety of electronic components including, without limitation, micro processors such as the well known 286, 386, and 486, as well as Pentium™ chips. Printed circuit substrate 12, in turn, comprises (typically) a glass fiber-reinforced epoxy polymer card having first and second mutually parallel sides 14 and 16 and a preselected thickness 12t.

The integrated circuit chip 20 comprises a generally rectangularly shaped body having dimensions 20H and 20L and having at least one flat bottom surface 22. A plurality of electrical connections 24 adapted for surface mount applications are provided along the four edges of chip 20, as shown in FIGS. 1, 2 and 3.

FIG. 4, as indicated, shows a portion of the top surface of a printed circuit substrate and illustrates clearly a very important prerequisite of printed circuit substrates which are intended to be used with the subject invention. More specifically, it will be observed that the substrate 112 has on the surface thereof a plurality of electrical circuits printed thereon using state-of-the-art techniques, the specific partial circuit depicted in FIG. 4 being of no special significance, but merely an illustrative example of a printed circuit. However, in FIG. 4, it will be noted that the printed circuit layout has been designed or preselected so that the wiring laid out thereon (and/or therein in the case of multilayered boards) is in a predetermined "architecture" so as to provide a space which is (i) without wiring, and (ii) at least as large as the flat bottom surface of the chip intended to be mounted on the aforesaid space. In FIG. 4, the wiring architecture has routed all of the circuits so as to leave, without any wiring, two spaces (i.e., 1125-1 and 1125-2).

In the above description of the chip 20, the body thereof was described as having a rectangular shape with the two dimensions 20H and 20L and at least one flat surface 22. Those skilled in the art will recognize that square, oval, circular and other shapes for the body may also be used with the present invention, so long as such bodies have at least one flat surface corresponding to the flat surface 22 of the chip 20 shown in FIGS. 1–3; thus, the adjective "rectangular" is intended to cover, generically, all such shapes.

The invention further includes at least one and preferably a plurality of elongated thermal conductive members 30, each having (i) a head portion, and (ii) an elongated body portion connected at one end thereof to the head portion. In the drawings (see especially FIG. 6), the elongated thermal conductive members are designated by reference numeral 30 having head portions 30H and elongated body portions 30B connected at one end thereof to the head portions and having the other end designated by reference numeral 30E. The members 30 are characterized by being made of a material of high thermal conductivity such as copper, silver or other material having a high coefficient of thermal conductivity. The elongated body portion 30B is of a preselected length 30L greater than the preselected thickness 12t of the substrate 12. For each thermal conductive member 30, there is a preselected hole or aperture 32 provided in the substrate 12 (see FIG. 6), the diameter of the aperture 32 being sufficient to permit the passing therethrough the body portion 30B of the thermal conductive member 30.

In the preferred embodiment of the invention, an additional thermal conductive means 31 is provided on the second side 16 of the substrate 12 for receiving and thermally contacting the second end 30E of the body portion 30B of the elongated thermal conductive members 30.

The preferred embodiment of the invention further provides for the underside of the head portion 30H of the members 30 being in abutting relationship with the top surface 14 of the substrate 12 and with the members 31, having a surface thereof in close abutting relationship with the underside 16 of the substrate 12. As shown in FIG. 5A, the members 31 have a circular configuration or washer-like configuration, the inner diameter of the washer being preselected so as to snugly contact the cylindrical surface of body portion 30B of the members 30. This is important so as to maximize the coefficient of heat transfer from the heads 30H to the ends 30E and associated members 31.

In some applications, sufficient heat transfer may be obtained without using the auxiliary or additional thermal conductive means 31. Another feature of the invention is, where space is available, to have the longitudinal length of the body portion 30B of the members 30 extended to 30E' from the dimension 30L shown in FIG. 6 to a greater length 30L-AA shown in FIG. 6.

Figure 5:
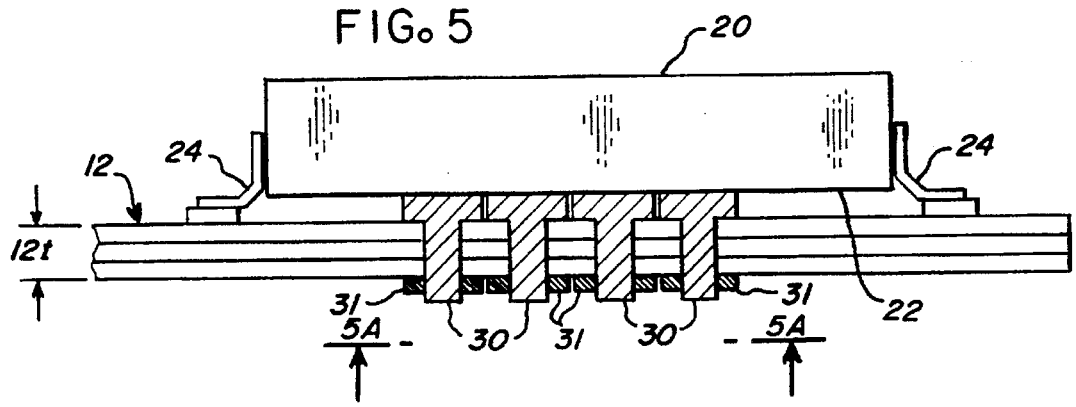
FIG. 5 is a view in cross-section of a substrate including a surface mounted integrated circuit chip showing the abutment of the undersurface of the chip with the head portions of a plurality of elongated thermal conductive members.
Figure 5A:
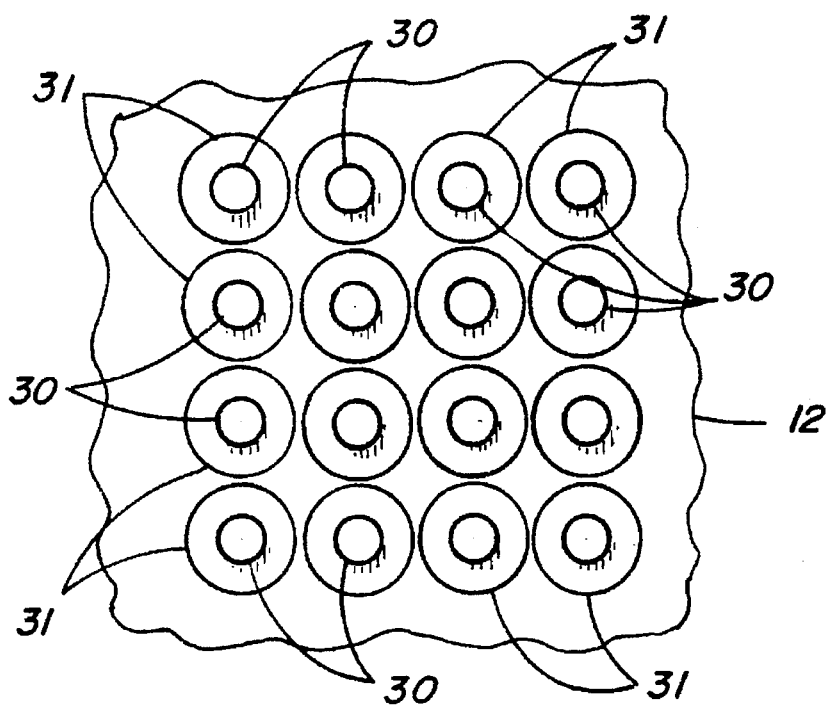
FIG. 5A is a view of the substrate of FIG. 5 as viewed along section lines 5A—5A.

In FIGS. 5 and 7, four of the members 30 are depicted in cross-section. Referring to FIG. 4, in space 1125-2, an array of sixteen of the thermal conductive members are depicted in a 4×4 layout, the heads 30H of these members being depicted.

As mentioned above, the layout of the holes or apertures in the substrate (for receiving the thermal conductive members) is preselected in accordance with the desired heat transfer for a preselected I.C. chip. Thus, in FIG. 4, the heads 30H are shown in four rows of four so as to define a square shape. My invention permits the holes to be laid out on a preselected basis to customize the resultant heat transfer capability to match the shape of the chip package.

Also, a given chip may have a non-linear heat distribution; my invention permits a layout which will match such non-linear distribution. To explain, visualize the arrangement of FIG. 4, but with some of the thermal conductive members removed so that the resultant heat transfer profile provided by the retained members matches the expected heat generating function of the associated I.C. chip.

In operation, the integrated chip 20 is electrically connected to the substrate 12 via beams 24 after the prior installation of the thermal conductive members 30. In operation of the integrated chip, the heat generated therein may be transferred (to thereby minimize temperature buildups in the chip) from the underside 22 of the chip body into the head portions 30H of the members 30 and thence through the bodies 30B thereof to the ends 30E thereof (and/or 30E' for the alternate embodiment) and/or into the auxiliary thermal conductive means 31. It will be understood that the greater the difference in temperature between the two ends of the thermal conductive members 30, the greater the coefficient of heat transfer, other relevant factors of course being the dimensions of the members 30 (and 31) and the coefficient of thermal conductivity of the material selected for the members 30.

As indicated, FIG. 7 depicts a through hole type means for providing electrical connections to the substrate 12AA. This illustration is for the purpose of showing the versatility of the present invention.

Figure 8:
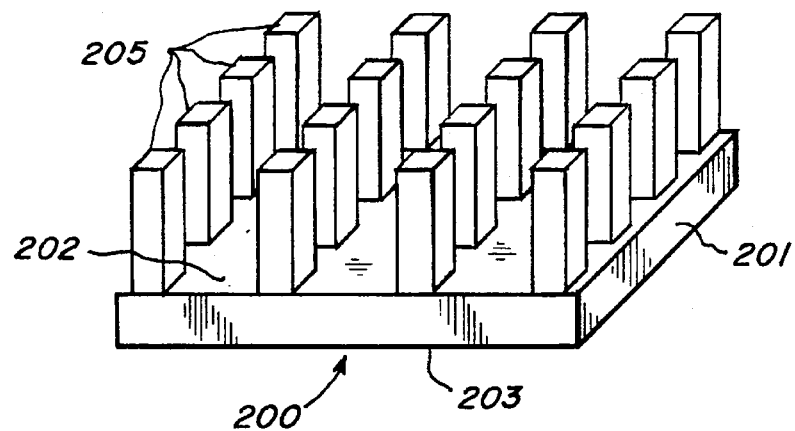
FIG. 8 shows an alternate arrangement in perspective.
Figure 9:
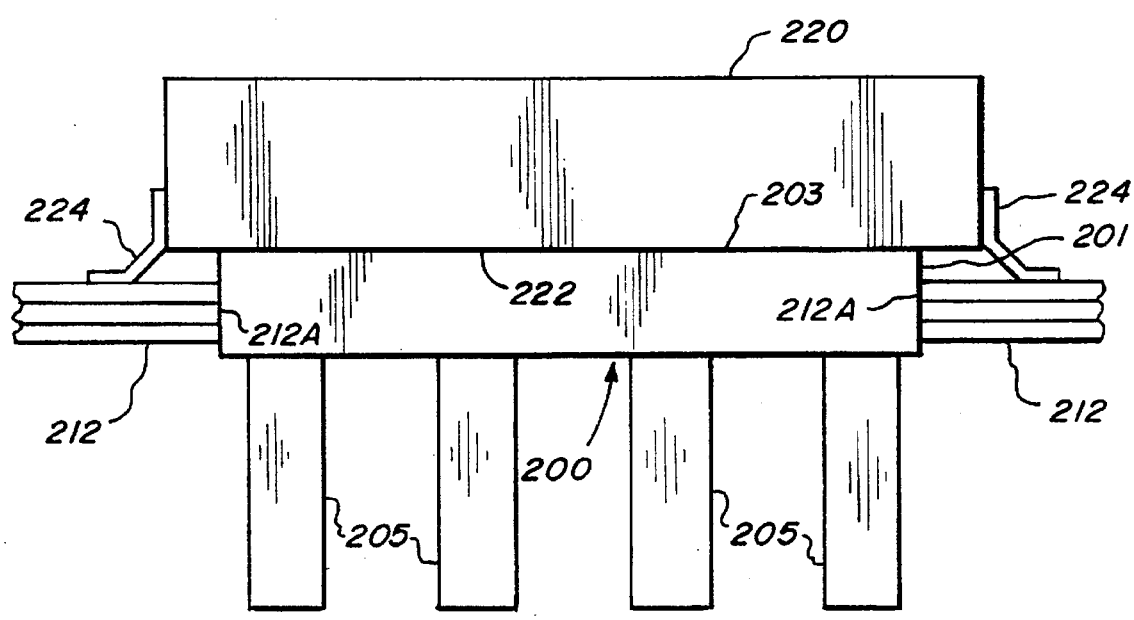
FIG. 9 shows a side view of the apparatus of FIG. 8.

As indicated, the invention can be implemented in other embodiments. For example, FIGS. 8 and 9 depict a unitary heat transfer means comprising a unitary heat sink 200 made of copper or other material having a high coefficient of heat conductivity. The member 200 is shown in perspective in FIG. 8; it comprises a flat rectangular shaped body 201 having a plurality of bars 205 extending or depending from a face 202 thereof. The opposite side of body 201 is 203. The bars 205 are shown to be parallel to one another and to have the same longitudinal length, but this is not critical. The bars 205 are also shown to have a square cross section, but other cross sections such as circular, oval, hexagon, etc. could be used. The intent of the bars is to provide a large surface area for dissipation of heat transferred into the member 200 from the associated electronic component 220 shown in FIG. 9. In FIG. 9, item 220 could be a micro processor adapted to be mounted on a substrate 212 using appropriate mounting means such as a surface mount tabs 224. The substrate has an opening 212A therein sized so as to receive the rectangular body 201 of the member 200. Referring to FIG. 9, the body 201 is positioned as shown with the other flat surface 203 being uppermost and with the other flat surface 202 with the depending bars 205 extending downwardly. The underside 222 of the micro processor 220 is abutted against surface 203 of the heat transfer means and is bonded thereto using a suitable thermal adhesive (not shown). Further, as indicated, the micro processor would be electrically connected to other circuitry (not shown) on or in the substrate 212 through the medium of the surface mount means 224.

It will be noted in FIG. 9 that the opening 212A is sized to be almost the same as the micro processor 220. This permits the surface 203 of the heat transfer means to engage at least fifty percent (50%) of the underside of the micro processor 220.

Figure 10:
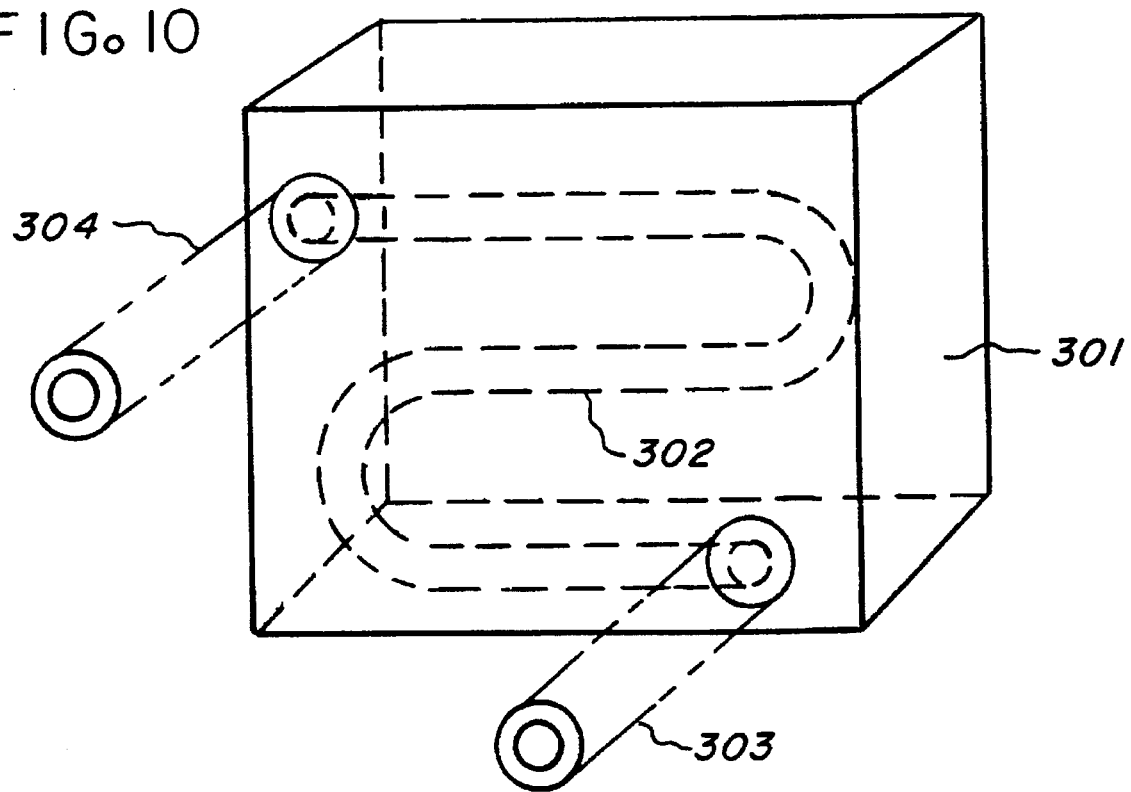
FIG. 10 shows another embodiment of the invention.

FIG. 10 shows another embodiment of the invention where a block 301 is shown having a rectangular shape and sufficient thickness to receive and surround a cooling coil 302 having an inlet 303 and an outlet 304 adapted to be connected to a source of cooling means such as a refrigerant, cooled water, etc. It is intended that the block 301 would be inserted into an aperture or opening similar to opening 212A of FIG. 9 with one side of the cooling block being adapted to be in intimate contact with the underside of the micro processor so that heat from the micro processor may be transferred into the block 301 and thence to the cooling medium in the coil 302 to be removed via outlet 304.

Figure 11:
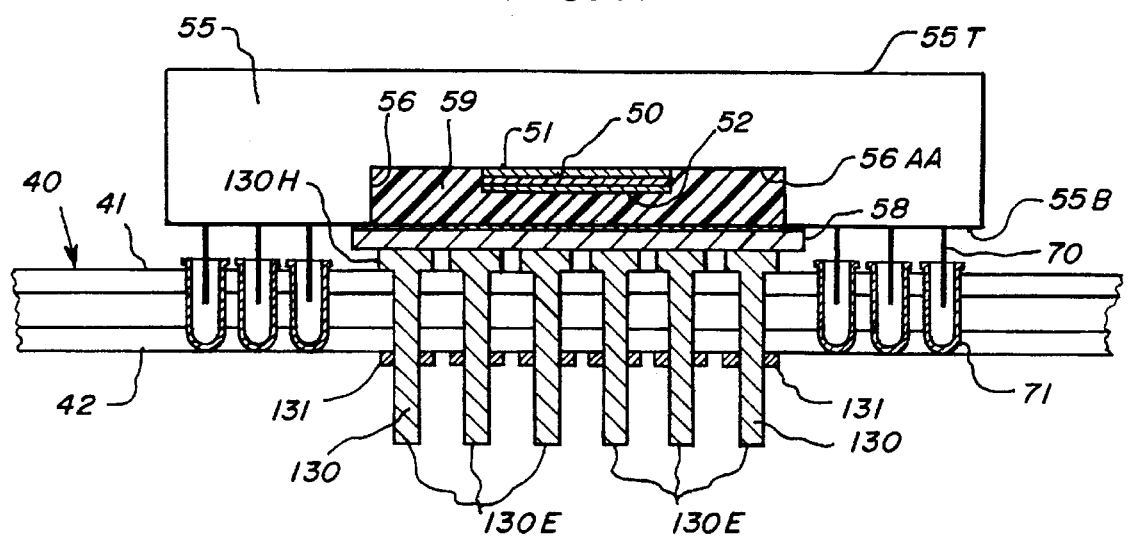
FIG. 11 shows another embodiment of the invention.

Another embodiment of the invention is shown in FIG. 11. A printed circuit board or substrate 40 has a top 41 and a bottom 42 and is generally similar to the boards or substrates shown in FIGS. 1–7. A chip or die carrier 55 has a top 55T and a bottom 55B and, further, has a recess or void 56 in the bottom which is significantly larger than a P.C. die 50 mounted or bonded at the top 51 thereof to the upper surface 56AA of the recess 56. Thus, the bottom 52 of the die 50 is spaced from the bottom 55B of the carrier 55.

A plate 58 of metal or other material having good thermal conductive characteristics is provided to seal off the recess or void 56, and the void is completely filled with a plastic thermal conductive material 59 which is applied by a suitable means such as injection prior to the affixation of the plate 58. A suitable material is sold by the Bergquist Company, Minneapolis, Minn., and is identified as the Sil-Pad Thermally Conductive Insulation product.

Figure 6:
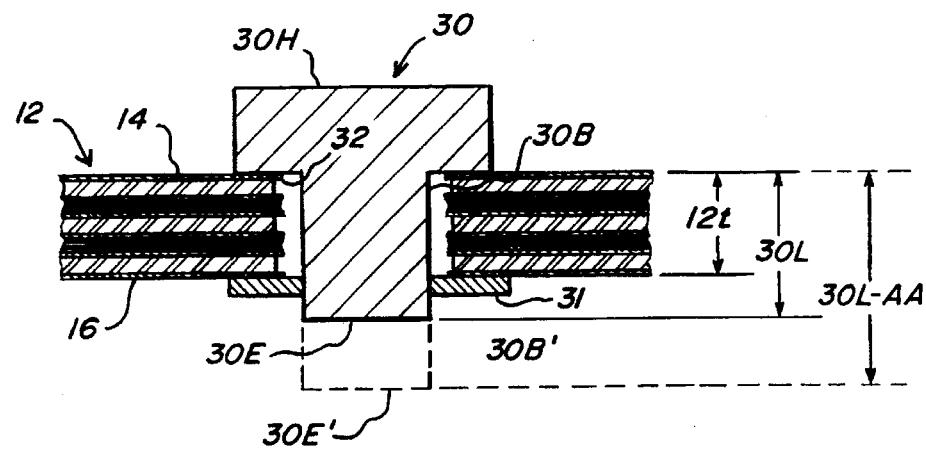
FIG. 6 is an enlarged view in cross-section of a multilayer printed circuit board utilizing one of the elongated thermal conductive members of my invention.

A plurality of elongated thermal conductive members 130 are provided and extend through suitable apertures in the substrate 40 and are generally similar to members 30 shown in FIGS. 5–7, except they have a significantly longer longitudinal length. Thus, the undersides of the heads 130H abut against the top 41 of the substrate 40, and the other ends 130E are significantly below the bottom 42 of the substrate. Each member 130 may pass through a thermally conductive member 131 to be retained in position as shown. Also, the members 131 add to the surface area for heat transmission.

The bottom of plate 58 abuts the top plannar surfaces of the top sides of heads 130H of members 130.

A plurality of leads 70 connected from the I.C. die 50 extend and depend from the bottom of the carrier 55 and register with suitable electrical connector means 71 in the substrate 40.

Thus, heat generated in the I.C. die 50 may be carried away efficiently to thus enable enhanced performance. The heat flow path is from the die 50 through thermal conductive material 59 and metal plate 58 to the tops or heads 130H of the elongated thermal conductive members 130 and thence to the ends 103E thereof, the heat in part being dissipated along the longitudinal extent of the members 130 and by the cooperating retainer members 131.

I claim:

1. Heat dissipative apparatus for an integrated circuit chip package mounted on a printed circuit substrate comprising in combination:

(a) an integrated circuit chip and a chip carrier having a recess therein with respect to a side thereof for receiving said chip, said recess and said chip being sized so that when said chip is positioned within said recess a void space is defined between said chip and said carrier side;

(b) a thermal conductive plate having a first side abutting said carrier side and closing off said recess;

(c) thermal conductive material positioned in said void space and functioning to provide heat transfer from said chip to said plate;

(d) a printed circuit substrate having first and second mutually parallel sides and a preselected thickness, said substrate having, on said first side, means for receiving and mounting said plate, said receiving and mounting means including a plurality of elongated thermal conductive members, each having (i) a head portion planar with said first side, and (ii) an elongated body portion connected at one end to said head portion and having a longitudinal length greater than said preselected thickness of said substrate and said body portion of said thermal conductive member extending through one of a plurality of preselected holes in said substrate adjacent to and proximate to the body of said chip, said holes being located in accordance with a preselected pattern; and (e) thermal conductive means on said second side of said substrate for receiving a second end of said body portion of said elongated thermal conductive member; whereby heat may be conducted from said integrated chip, mounted as aforesaid, through said thermal conductive material, said thermal conductive plate, and through said elongated thermal conductive members to said second side of said substrate.

2. Apparatus of claim 1 further characterized by said thermal conductive means on said second side of said substrate comprising a flat, washer-like member having a central preselected aperture for receiving the other end of said elongated body portion of said thermal conductive members.

3. Apparatus of claim 2 further characterized by said washer-like member being connected to said other end of said thermal conductive member to facilitate heat transfer therebetween and to thereby increase the heat transfer coefficient between said body and said second side of said substrate.

4. Apparatus of claim 1 further characterized by said printed circuit substrate including preselected printed circuit wiring laid out thereon and/or therein in a predetermined architecture to provide a space which (i) is without wiring, and (ii) is at least as large as said side of said carrier.

* * * * *